United States Patent
Vera et al.

(10) Patent No.: US 10,116,269 B1
(45) Date of Patent: Oct. 30, 2018

(54) DIFFERENTIAL AMPLIFIER WITH EXTENDED BANDWIDTH AND THD REDUCTION

(71) Applicant: INPHI CORPORATION, Santa Clara, CA (US)

(72) Inventors: Leonardo Vera, Thousand Oaks, CA (US); Carl Pobanz, Thousand Oaks, CA (US); James Hoffman, Thousand Oaks, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/958,984

(22) Filed: Apr. 20, 2018

Related U.S. Application Data

(63) Continuation of application No. 15/582,439, filed on Apr. 28, 2017, now Pat. No. 9,979,358.

(51) Int. Cl.
| | | |
|---|---|---|
| H03F 1/32 | (2006.01) | |
| H03F 1/48 | (2006.01) | |
| H03F 3/45 | (2006.01) | |

(52) U.S. Cl.
CPC ........... *H03F 1/3211* (2013.01); *H03F 1/483* (2013.01); *H03F 3/45094* (2013.01); *H03F 3/45192* (2013.01); *H03F 2200/498* (2013.01)

(58) Field of Classification Search
CPC ........................................................ H03F 1/32
See application file for complete search history.

(56) References Cited

U.S. PATENT DOCUMENTS

| | | | | |
|---|---|---|---|---|
| 7,860,454 B2* | 12/2010 | Moloudi | ............ | H03H 11/1291 330/300 |
| 2004/0232988 A1* | 11/2004 | Nakatani | ............. | H03F 3/45089 330/252 |
| 2007/0176679 A1* | 8/2007 | Kluge | ..................... | H03F 1/565 330/253 |
| 2009/0072868 A1* | 3/2009 | Choi | ..................... | G11C 27/024 327/94 |
| 2010/0328542 A1* | 12/2010 | Kammula | ........... | H03F 3/45179 348/725 |
| 2018/0095491 A1* | 4/2018 | Lacy | ........................ | G05F 3/262 |

\* cited by examiner

*Primary Examiner* — Patricia T Nguyen
(74) *Attorney, Agent, or Firm* — Richard T. Ogawa; Ogawa P.C.

(57) ABSTRACT

The present invention is directed to electrical circuits. More specifically, an embodiment of the present invention provides a differential amplifier in cascode configuration. An input transistor is coupled to an output transistor via a peaking inductor. The output transistor is also directly coupled to a degeneration resistor. There are other embodiments as well.

20 Claims, 12 Drawing Sheets

DIFFERENTIAL AMPLIFIER WITH EXTENDED BANDWIDTH AND THD REDUCTION

CROSS-REFERENCES TO RELATED APPLICATIONS

The present application is a continuation of and claims priority to U.S. application Ser. No. 15/582,439, filed Apr. 28, 2017, commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits and techniques thereof.

Linear amplifiers have a wide range of applications. Typically, linear amplification refers to the ability to have an output linearly proportional to an input. Among linear amplifiers, cascode based designs have been a popular choice. Compared to single stage amplifiers, cascode amplifiers often offer a high level of isolation, high input impedance, high gain, and high bandwidth. Since its invention in early 1900s, various versions of cascode amplifiers have been proposed and used, including vacuum tube and transistor implementations. In transistor implementations, both bipolar junction transistors (BJT) and field effect transistors (FET) can be used to implement cascode amplifiers.

Unfortunately, while there are many existing cascode amplifiers, they have been inadequate, as explained below. It is thus to be appreciated that new and improved amplifiers are desired.

BRIEF SUMMARY OF THE INVENTION

The present invention is directed to electrical circuits. More specifically, an embodiment of the present invention provides a differential amplifier in cascode configuration. An input transistor is coupled to an output transistor via a peaking inductor. The output transistor is also directly coupled to a degeneration resistor. There are other embodiments as well.

According to an embodiment, the present invention provides an amplifier device that includes a first transistor with a first base terminal and a first collector terminal. The first base terminal is coupled to a first input. The device also includes a second transistor with a second base terminal and a second collector terminal. The second terminal base is coupled to a second input. The device further includes a first peaking inductor coupled to the first collector terminal. The device also has a second peaking inductor coupled to the second collector terminal. The device includes a third transistor with a third base terminal and a first emitter terminal. The first emitter terminal is coupled to the first peaking inductor. The device also includes a fourth transistor with a fourth base terminal and a second emitter terminal. The second emitter terminal is coupled to the second peaking inductor. The device additionally has a degeneration resistor coupled to the third base terminal and the fourth base terminal.

According to another embodiment, the present invention provides an amplifier device that has a first transistor with a first gate terminal and a first drain terminal. The first gate terminal is coupled to a first input. The device also includes a second transistor with a second gate terminal and a second drain terminal. The second gate terminal is coupled to a second input. The device also includes a first peaking inductor coupled to the first drain terminal. The device further includes a second peaking inductor coupled to the second drain terminal. The device has a third transistor with a third gate terminal and a first source terminal. The first source terminal is coupled to the first peaking inductor. The device also includes a fourth transistor with a fourth gate terminal and a second source terminal. The second source terminal is coupled to the second peaking inductor. The device includes a resistive element coupled to the third gate terminal and the fourth gate terminal.

According to yet another embodiment, the present invention provides a degenerated differential cascode amplifier device. The device has a first BJT transistor with a first base terminal and a first collector terminal and a first emitter terminal. The first base terminal is coupled to a first input. The device also includes a first degeneration resistor coupled to the first emitter terminal. The device also includes a second BJT transistor with a second base terminal and a second collector terminal and a second emitter terminal. The second terminal base is coupled to a second input. The device further has a second degeneration resistor coupled to the second emitter terminal. The device additionally includes a first peaking inductor coupled to the first collector terminal. The device also includes a second peaking inductor coupled to the second collector terminal. The device further includes a third transistor with a third base terminal and a third emitter terminal. The third emitter terminal is coupled to the first peaking inductor. The device also includes a fourth transistor with a fourth base terminal and a fourth emitter terminal. The fourth emitter terminal is coupled to the second peaking inductor. The device also includes a degeneration resistor coupled to the third base terminal and the fourth base terminal.

It is to be appreciated that embodiments of the present invention provide many advantages over conventional techniques. Among other things, differential cascode amplifiers according to embodiments of the present invention provide both increased bandwidth and reduced harmonic distortion compared to existing amplifiers. Among other features, peaking inductors positioned between input and output transistors significantly extend amplifier bandwidth, while the degeneration resistor reduces amplifier distortion. Additionally, compared to conventional amplifiers, the use of peaking inductors and degeneration resistor, depending on the implementation, only have minimal negative impact on the amplifier circuits in terms of device area.

Embodiments of the present invention can be implemented in conjunction with existing systems and processes. For example, variable gain amplifiers according to embodiments of the present invention can be used in lieu of conventional amplifiers in many applications. Additionally, amplifiers according to embodiments of the present invention can be manufactured using existing manufacturing techniques, processes, and equipment. There are many other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
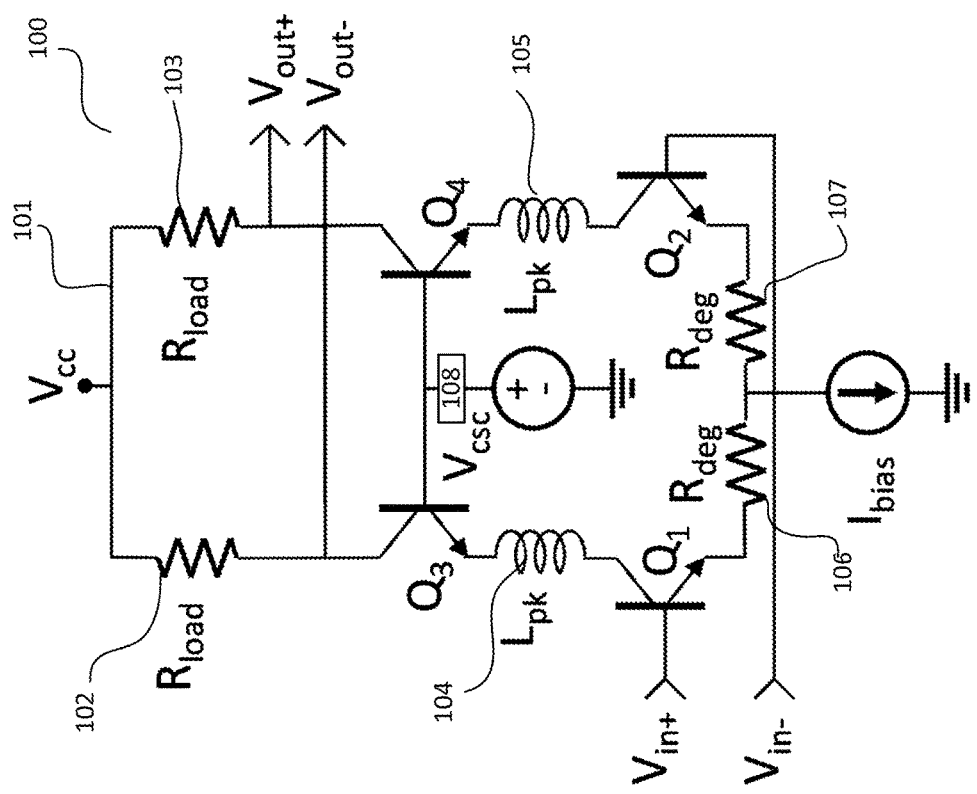
FIG. 1 is a simplified diagram illustrating a cascode amplifier according to an embodiment of the present invention.

The present invention is directed to electrical circuits. More specifically, an embodiment of the present invention provides a differential amplifier in cascode configuration. An input transistor is coupled to an output transistor via a peaking inductor. The output transistor is also directly coupled to a degeneration resistor. There are other embodiments as well.

As mentioned above, existing amplifiers have been inadequate. Among other features, communication applications often demand both high bandwidth and low distortion. A linear amplifier (e.g., used as an optical modulator driver) is typically required to provide an accurate amplified copy of the input signal. The operating frequency of the amplifier needs to be maximized to cope with continuously increasing data rate requirements, and the distortion introduced by the amplifier needs to be minimized. More specifically, amplifiers need to provide linear amplification for a maximized bandwidth while minimizing the distortion of the amplifier. However, increasing the bandwidth may increase the amplifier distortion, which is typically measured in terms of total harmonic distortion (THD). By increasing the bandwidth and reducing the distortion attributed to the amplifier, data transmission can be performed at high data rates to satisfy continuously increasing demand on bandwidth and performance.

It has to be appreciated that embodiments of the present invention provide differential cascode amplifiers with improved cascode designs that provide extended bandwidth and minimized distortion. Compared with existing amplifiers, there is substantially no power penalties and minimal increment in device area. More specifically, embodiments of the present invention provide a degenerated differential cascode stage amplifier. Among other benefits, a cascode topology based amplifier reduces the effect of the Miller capacitance from the common-emitter transistor (or its MOSFET equivalent). One of the ways to improve performance is to have a reduction of the capacitive loading at the output of the amplifier to increase the bandwidth. In various embodiments, further increase of bandwidth is obtained by using inductive peaking. For example, inductors are provided between the common-emitter and common-base (or corresponding terminals in MOSFET implementations) transistors that form the cascode amplifier. It is to be noted that adding inductors to cascode amplifiers may, as a side effect, increase the distortion generated by the amplifier. It is to be appreciated that embodiments of the present invention provide cascode amplifiers with wide bandwidth and low distortion. More specifically, differential cascode amplifiers according to embodiments of the present invention afford extended bandwidth (compared to conventional cascode amplifiers) and reduced distortion associated with inductors and increased bandwidth. Additionally, cascode amplifiers according to embodiments of the present invention have minimal impact in area and substantially no increase in power consumption compared to existing amplifiers. In various implementations, differential cascode amplifiers according to the present invention utilize inductive peaking between common-emitter and common-base stages (or corresponding terminals in MOSFET implementations). Additionally, resistive degeneration is provided at the differential common-base stage.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a cascode amplifier according to an embodiment of the present invention. This diagram is merely an example, which should not unduly limit the scope of the claims. One of ordinary skill in the art would recognize many variations, alternatives, and modifications. In FIG. 1, cascode amplifier 100 includes a pair of input transistors $Q_1$ and $Q_2$, which are respectively coupled to input voltages $V_{in+}$ and $V_{in-}$. As shown in FIG. 1, cascode amplifier 100 is implemented using bipolar junction transistors (BJT), but it is to be understood that other types of transistors (e.g., MOSFET described below) can be used as well. The input signals are coupled to bases of transistors $Q_1$ and $Q_2$. Emitters of transistors $Q_1$ and $Q_2$ are coupled to bias current source $I_{bias}$ via degeneration resistors 106 and 107. The collector of transistor $Q_1$ is coupled to peaking inductor 104, which is also coupled to the emitter of transistor $Q_3$. The collector of transistor $Q_2$ is coupled to peaking inductor 105, which is also coupled to the emitter of transistor $Q_4$. For example, transistors $Q_3$ and $Q_4$ are BJTs. As mentioned above, peaking inductors 104 and 105 are specifically provided to increase the bandwidth of amplifier 100. Unfortunately, peaking inductors 104 and 105 may also introduce distortion when operating. The bases of transistors $Q_3$ and $Q_4$ are coupled to a resistive element 108, which is also coupled to voltage source $V_{CSC}$. For example, voltage source $V_{CSC}$ provides a bias voltage. Collectors of transistors $Q_3$ and $Q_4$ are respectively coupled to load resistors 102 and 103. Output signals $V_{out+}$ and $V_{out-}$ are configured between the collectors of transistors and load resistors.

Inductors 104 and 105 help increase the bandwidth of amplifier 100, but at the expense of introducing distortion. The resistive element 108 reduces distortion that is at least partially attributed to inductors 104 and 105. In various embodiments, resistive element 108 may be implemented using one or more resistors. For example, resistive element 108 may be referred to as a "degeneration resistor". For example, actual implementation of resistive element 108 may depend on the size of the inductors, components of amplifier 100, and desired performance characteristics (e.g., bandwidth, amplification, etc.), which are described below.

Figure 2A:
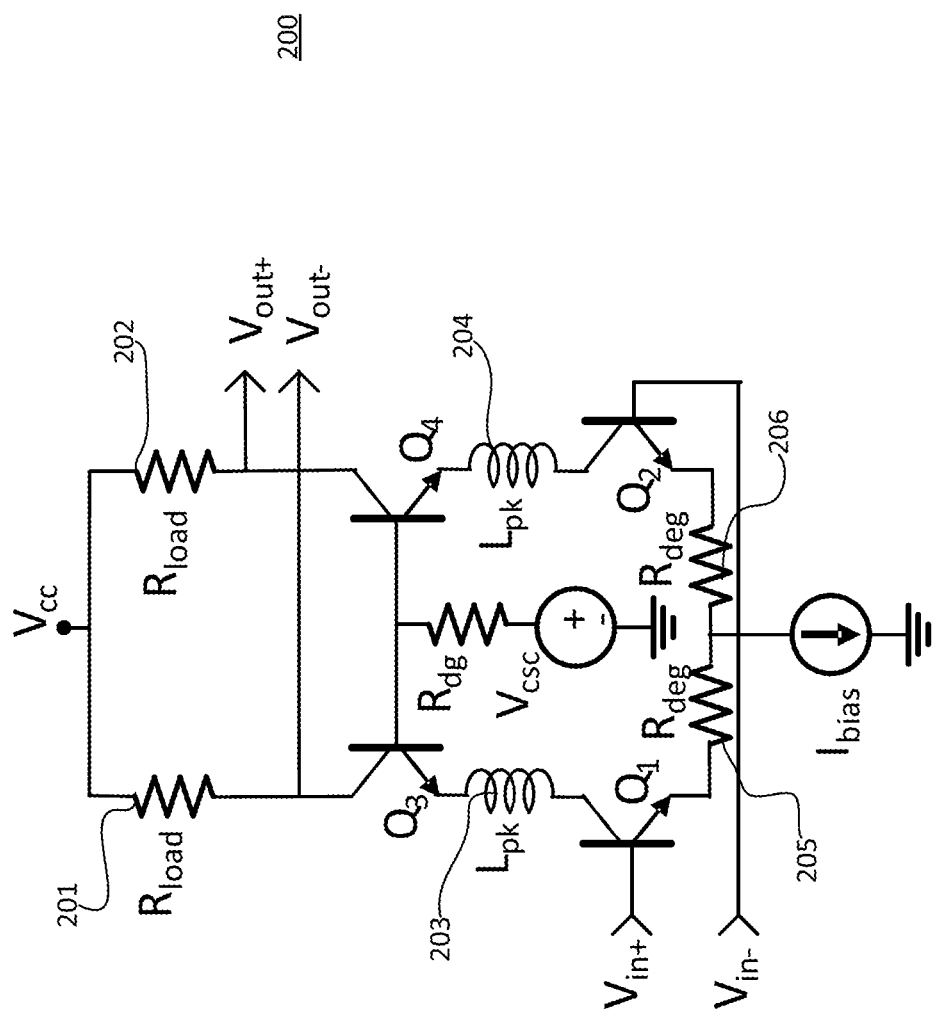
FIG. 2A is simplified diagram illustrating a specific implementation of cascode amplifier according to embodiments of the present invention.

FIG. 2A is simplified diagram illustrating a specific implementation of cascode amplifier according to embodiments of the present invention. This diagram is merely an example, which should not unduly limit the scope of the claims. One of ordinary skill in the art would recognize many variations, alternatives, and modifications. As shown in FIG. 2A, cascode amplifier 200 includes a degeneration resistor that is coupled to the base of transistors $Q_3$ and $Q_4$. The collector of transistor $Q_3$ is coupled to load resistor 201. The collector of transistor $Q_4$ is coupled to load resistor 202. The emitter of transistor $Q_3$ is coupled to inductor 203, which is also coupled to the collector of transistor $Q_1$. The emitter of transistor $Q_4$ is coupled to inductor 204, which is also coupled to the collector of transistor $Q_2$. For example, bases of transistors $Q_1$ and $Q_2$ are coupled to differential inputs $V_{in+}$ and $V_{in-}$. The emitters of transistors $Q_1$ and $Q_2$ are respectively coupled to degeneration resistors 205 and 206.

Figure 2B:
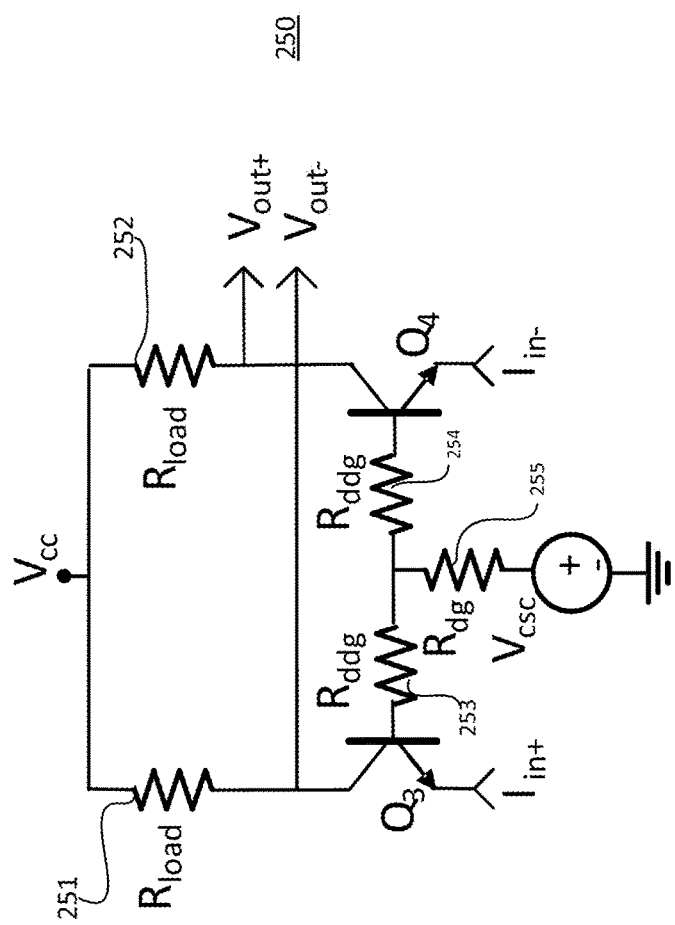
FIG. 2B is a simplified diagram illustrating an alternative implementation of cascode amplifier 250 according to embodiments of the present invention.

FIG. 2B is a simplified diagram illustrating an alternative implementation of cascode amplifier 250 according to embodiments of the present invention. This diagram is merely an example, which should not unduly limit the scope of the claims. One of ordinary skill in the art would recognize many variations, alternatives, and modifications. As shown in FIG. 2B, cascode amplifier 250 includes differential degeneration resistors $R_{ddg}$ 253 and 254 that reduce and/or eliminate oscillations in the differential mode operation. The common-mode degeneration resistor $R_{dg}$ 255 degenerates the common-mode signal, which allows for reduced THD. It is to be appreciated cascode amplifier 250 allows independent degeneration in the differential mode and the common-mode.

Figure 3A:
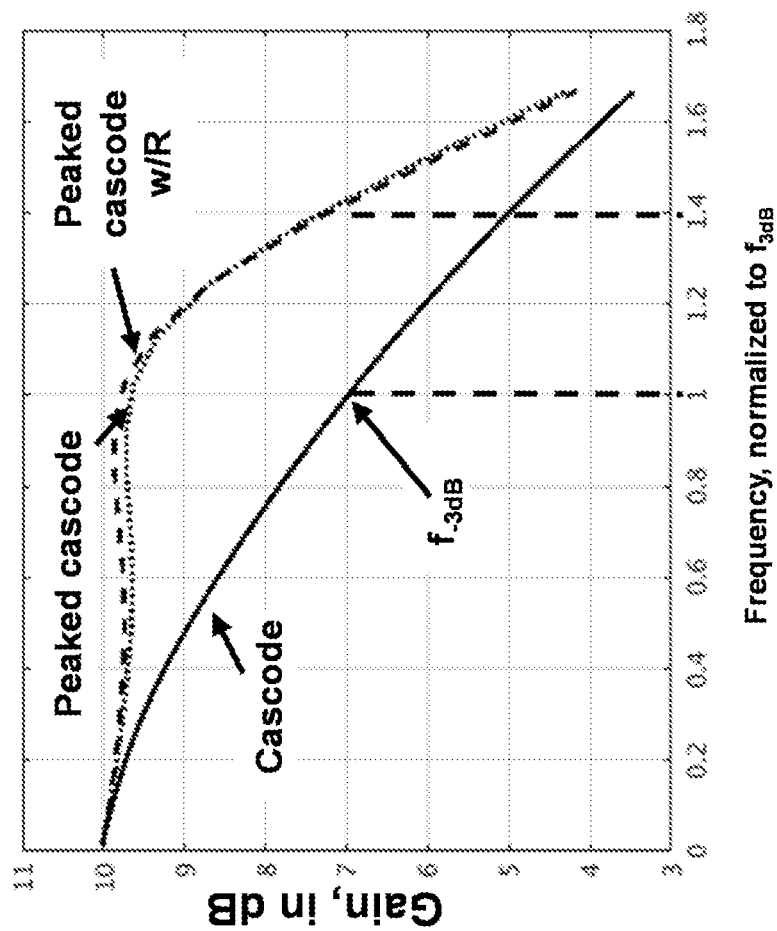
FIG. 3A is a graph illustrating gain vs. frequency of a modified cascode amplifier relative to a conventional cascode amplifier.
Figure 3B:
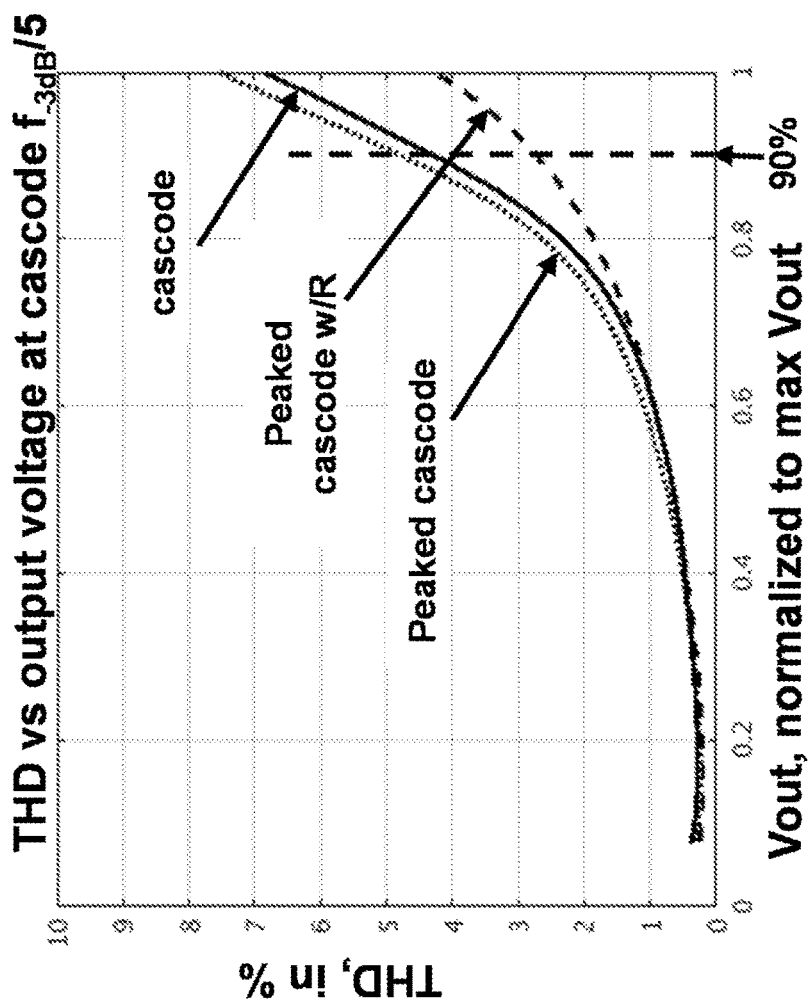
FIG. 3B is a graph illustrating total harmonic distortion (THD) vs. output voltage (obtained at ⅕ of the amplifier −3 dB cut-off frequency) of a modified cascode amplifier relative to a conventional cascode amplifier.
Figure 3C:
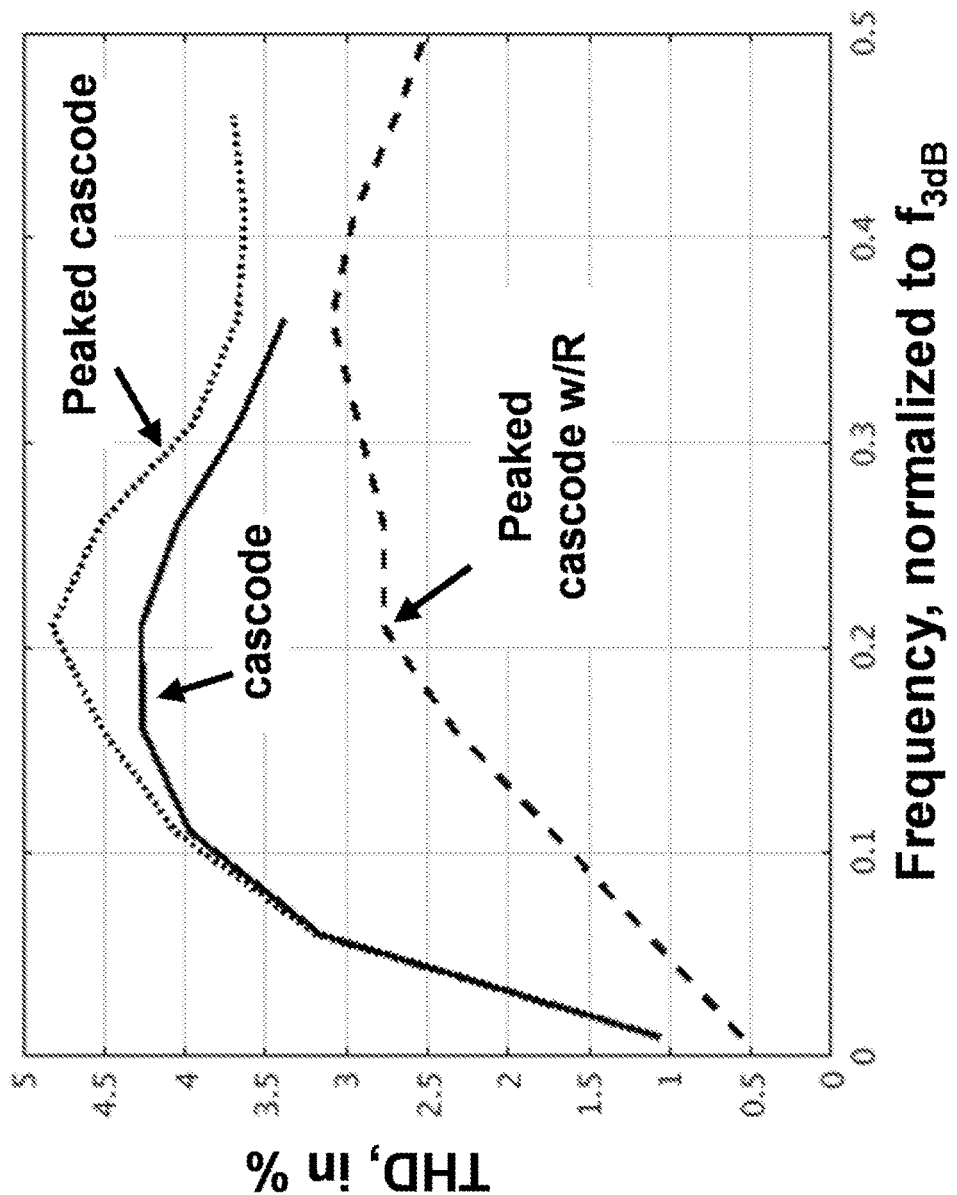
FIG. 3C is a graph illustrating THD vs. frequency (for an output voltage equal to 90% of the maximum value) of a modified cascode amplifier with degenerated common-base relative to a conventional cascode amplifier.

FIGS. 3A-3C are graphs illustrating performance of cascode amplifier 200 compared to conventional amplifiers. FIG. 3A is a graph illustrating gain of a modified cascode amplifier relative to a conventional cascode amplifier. As shown in FIG. 3A, the gain of a peaked cascode amplifier provides an increased gain at higher frequencies relative to a conventional cascode amplifier. More specifically, the frequency at which the gain drops by 3 dB, $f_{3dB}$, for the peaked cascode amplifier is 40% higher than that of the conventional cascode amplifier. For example, "Peaked cascode" in the graph refers to a cascode amplifier with peaking inductors, and "Peaked cascode w/R" refers to a cascode amplifier with both peaking inductors and degeneration resistor. It is to be noted that effect of degeneration resistor on the amplifier gain is relatively small.

FIG. 3B is a graph illustrating total harmonic distortion (at ⅕ of the respective −3 dB cut-off frequency) of a modified cascode amplifier relative to a conventional cascode amplifier. As shown in FIG. 3B, a cascode amplifier implemented with peaking inductor(s) (shown as "Peaked cascode") alone exhibit a slightly higher level of total harmonic distortion (THD) than a conventional cascode amplifier (shown as "cascode"). But with degeneration resistor, distortion is significantly reduced. A cascode amplifier with both peaking inductor(s) and degeneration resistor (shown as "Peaked cascode w/R") exhibits much less distortion than conventional cascode amplifier. At 90% of maximum output voltage level, the THD levels for conventional cascode amplifier and cascode amplifier with only peaking inductors are over 4%, while the THD level of the cascode amplifier with both peaking inductor(s) and degeneration resistor is at about 2%, which is about a 2% reduction in THD level.

FIG. 3C is a graph illustrating distortion of a modified cascode amplifier with degenerated common-base relative to a conventional cascode amplifier. As shown in FIG. 3C, by degenerating the common-base cascode transistors, even-order harmonics present in common-mode in the output signal are reduced (where the output voltage is set at about 90% of the maximum output voltage level). As can be seen in FIG. 3C, the amplifier with only peaking inductor(s) exhibits a higher level of THD compared to a conventional cascode amplifier. However, a cascode amplifier with both peaking inductor(s) and degeneration resistor (shown as "Peaked cascode w/R") is shown to have much lower THD across frequency than both the conventional cascode amplifier and the cascode amplifier with only the peaking inductor.

Figure 4:
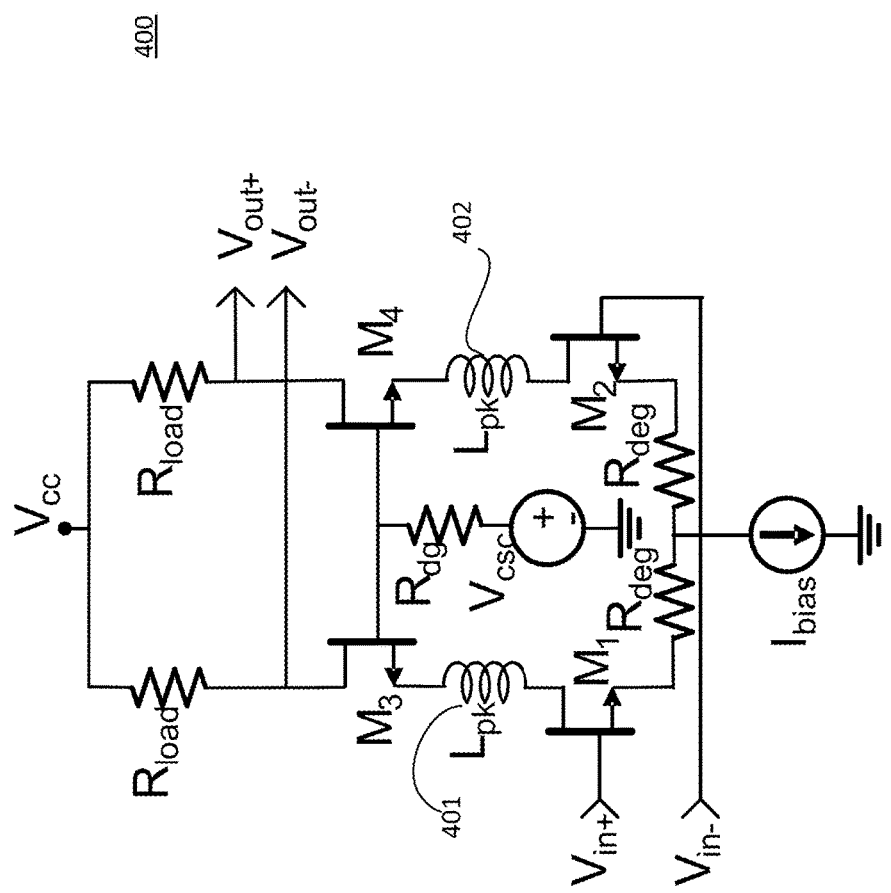
FIG. 4 is a simplified diagram illustrating MOSFET-based cascode amplifier according to an embodiment of the present invention.

FIG. 4 is a simplified diagram illustrating MOSFET-based cascode amplifier according to an embodiment of the present invention. This diagram is merely an example, which should not unduly limit the scope of the claims. One of ordinary skill in the art would recognize many variations, alternatives, and modifications. Cascode amplifier 400 includes a pair of input transistors $M_1$ and $M_2$. Gate terminals of transistors $M_1$ and $M_2$ are respectively coupled to input signals $V_{in+}$ and $V_{in-}$ as shown. For example, transistor $M_1$ and $M_2$ are metal-oxide semiconductor field-effect transistors (MOSFET), where cascode amplifiers 100 and 200 are implemented with BJT transistors. Source terminals of transistors $M_1$ and $M_2$ are coupled to degeneration resistors $R_{deg}$. The degeneration resistors $R_{deg}$ are also coupled to current source $I_{bias}$. The drain terminals of transistors $M_1$ and $M_2$ are coupled to peaking inductors. More specifically, the drain terminal of transistor $M_1$ is coupled to peaking inductor 401, which is also coupled to the source terminal of transistor M3. The drain terminal of transistor $M_2$ is coupled to peaking inductor 402, which is also coupled to the source terminal of transistor M4. The gate terminals of transistors $M_3$ and $M_4$ are coupled to a degeneration resistor $R_{dg}$, which is also coupled to voltage source $V_{CSC}$. As explained above, peaking inductors 401 and 402 increase amplifier bandwidth, and the degeneration resistor $R_{dg}$ reduces THD. The drain terminals of transistors $M_3$ and $M_4$ are coupled to load resistors and output terminals $V_{out+}$ and $V_{out-}$. As an example, transistors $M_1$, M2, M3, and M4 as shown are NMOS transistors, but it is to be understood that other types of transistors (e.g., PMOS transistors or combination of NMOS and PMOS transistors) may be used as well.

Figure 5A:
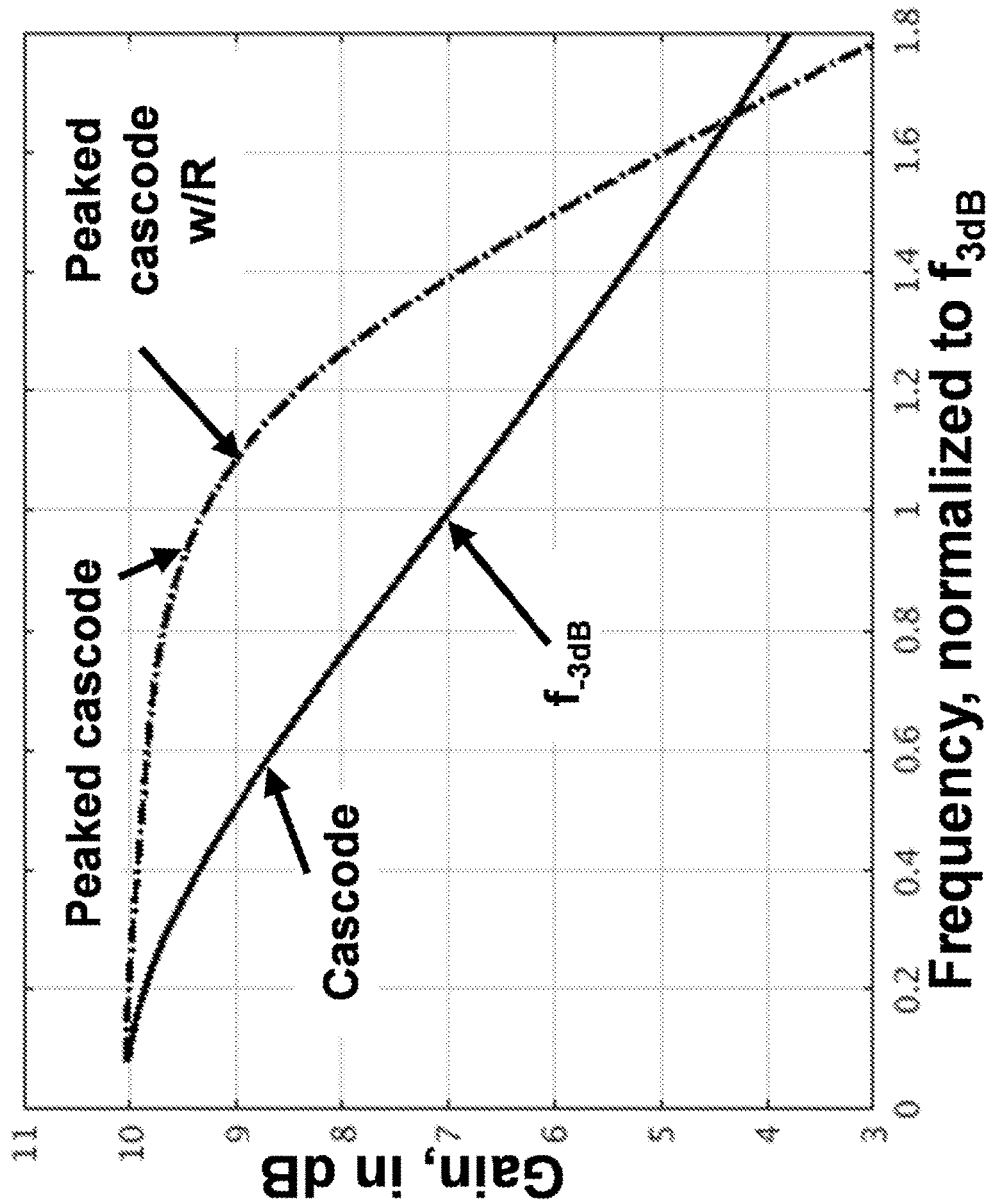
FIG. 5A is a graph illustrating gain vs. frequency of a modified cascode amplifier relative to a conventional cascode amplifier.
Figure 5B:
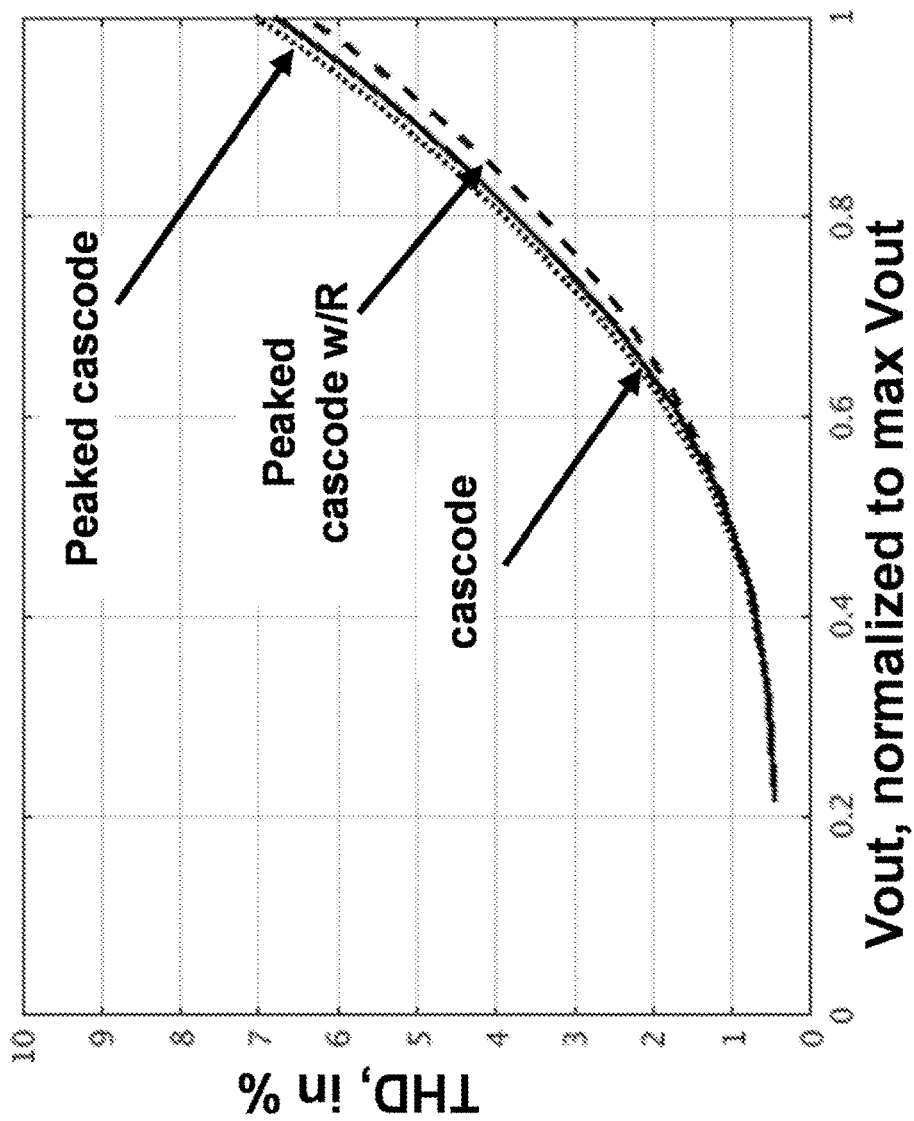
FIG. 5B is a graph illustrating THD vs. output voltage (obtained at ⅕ of the amplifier −3 dB cut-off frequency) of a modified cascode amplifier relative to a conventional cascode amplifier.
Figure 5C:
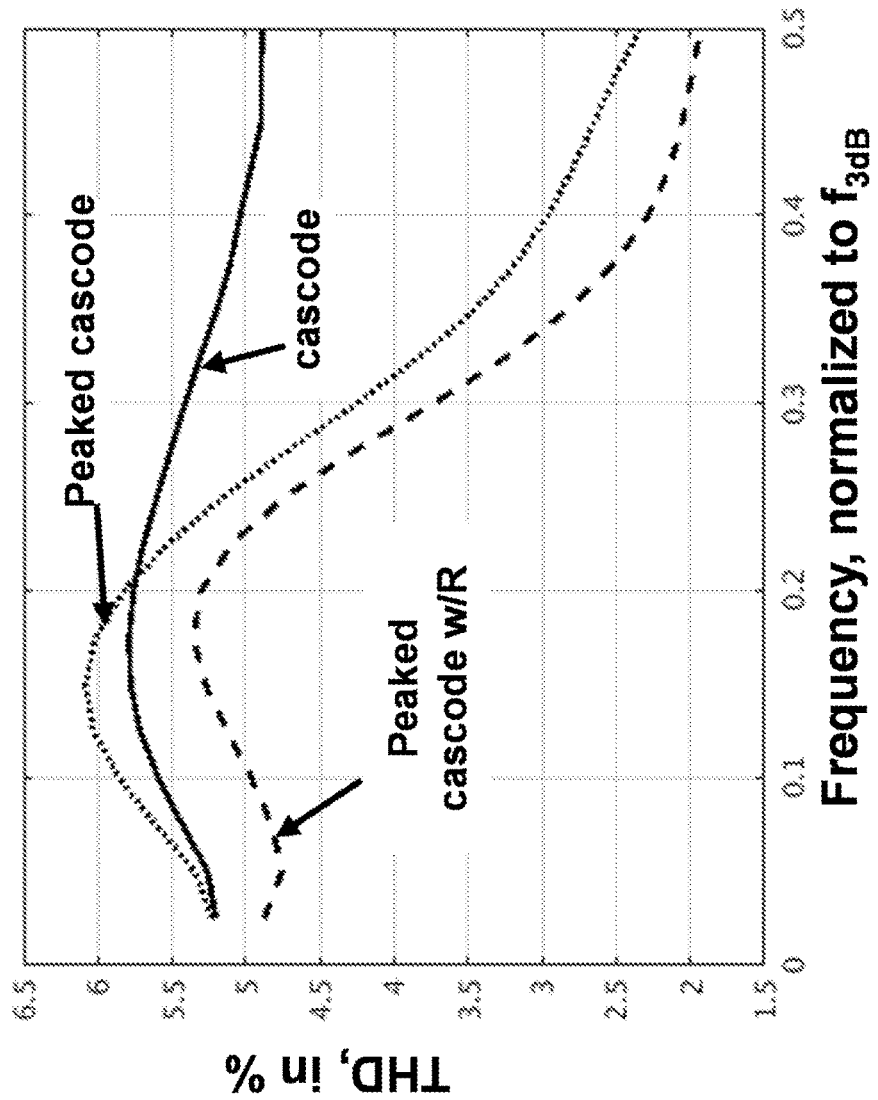
FIG. 5C is a graph illustrating THD vs. frequency (for an output voltage equal to 90% of the maximum value) at different frequencies of a modified cascode amplifier relative to a conventional cascode amplifier.

FIGS. 5A-5C are graphs illustrating performance of cascode amplifier 400 compared to conventional amplifiers. FIG. 5A is a graph illustrating gain of a modified cascode amplifier relative to a conventional cascode amplifier. As shown in FIG. 5A, cascode amplifiers implemented with peaking inductors ("Peaked cascode" and "Peaked cascode w/R"), both with and without degeneration resistor, provide increased gain over a wide range of frequency (as normalized frequency shown in FIG. 5A). At normalized frequency of "1", peaking inductors can bring an increase of gain by about 38%. It is also to be noticed that for cascode amplifiers with peaking inductors, the presence of degeneration resistor $R_{dg}$ does not affect much (if any at all) of the gain over frequency. Effectively, degeneration resistor $R_{dg}$ increases the common-mode impedance at the gates of transistors $M_3$ and $M_4$.

FIG. 5B is a graph illustrating THD of a modified cascode amplifier relative to a convention cascode amplifier. The plots are related to amplifiers operating at 90% of their maximum output levels. As shown in FIG. 5B, the cascode amplifier that is implemented with peaking inductors but no degeneration resistor ("Peaked cascode") exhibits a slightly higher level of THD than the conventional cascode amplifier. The modified cascode amplifier with both peaking inductors and degeneration resistor ("Peaked cascode w/R") exhibits less THD than both conventional cascode amplifier ("cascode") and "Peaked cascode" amplifier. Where the voltage output is close to its maximum (normalized to "1"), the "Peaked cascode w/R" provides a large amount (about 0.6%) of reduction in THD.

FIG. 5C is a graph illustrating THD at different frequency levels of a modified cascode amplifier relative to a conventional cascode amplifier. The plots are related to amplifiers operating at 90% of their maximum output. By degenerating the common-base cascode transistors, even order harmonics present in common-mode in the output signal are reduced.

Figure 6:
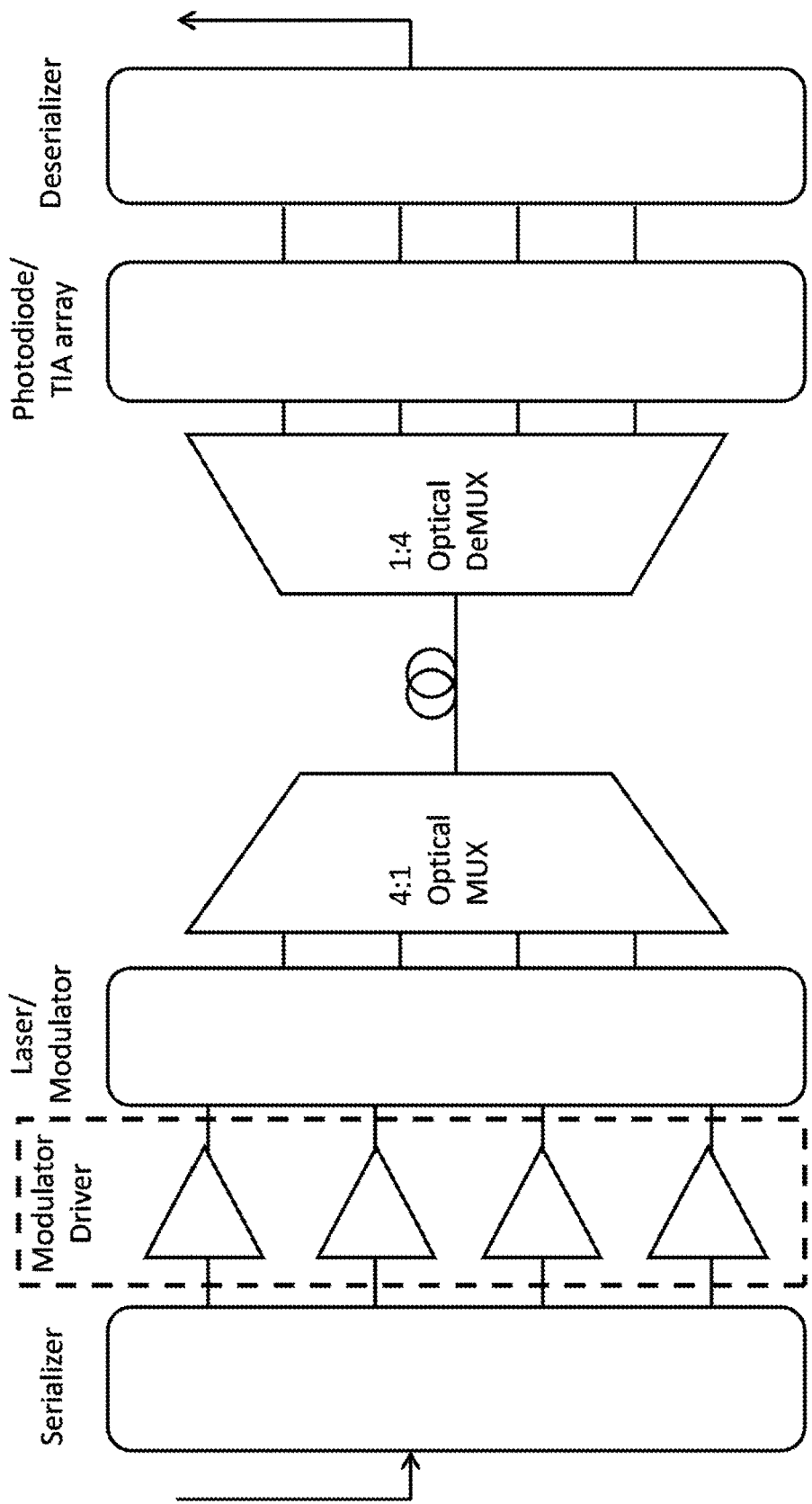
FIG. 6 is a simplified diagram illustrating an optical communication system utilizing a cascode amplifier according to embodiments of the present invention.

It is to be appreciated that modified cascode amplifiers according to the present invention can be used in many applications, both in data communication and more generally in electrical circuits. FIG. 6 is a simplified diagram illustrating an optical communication system utilizing a cascode amplifier according to embodiments of the present invention. This diagram is merely an example, which should not unduly limit the scope of the claims. One of ordinary skill in the art would recognize many variations, alternatives, and modifications. As an example, the modulator driver in FIG. 6 may use one or more cascode amplifiers (e.g., amplifier 200 or amplifier 400 described above) for its modulator driver. For example, serial data signals are amplified using cascode amplifiers, and the amplifier signals are then used to modulate outputs of laser devices. With both peaking inductors and degeneration resistor, cascode amplifiers according to embodiments of the present invention afford linearity, bandwidth, low-distortion, and/or other benefits compared to existing amplifiers, and these advantages are especially useful in data communication applications. Used as a part of the optical modulator driver, cascode amplifiers according to the present invention provide an accurate amplified copy of the input signal. The operating frequency of the amplifier can be maximized to cope with increasing data rate requirements, moreover, and the distortion attributed to the amplifier is minimized.

An important aspect of cascode amplifiers according to embodiments of the present invention is values of peaking inductors and degeneration resistor. For example, the value of degeneration resistor, which is coupled to the base terminals of BJT $Q_3$ and $Q_4$ in FIG. 1 and gate terminals $M_3$ and $M_4$ in FIG. 4, provides common-mode degeneration, and generally should be as high as possible. At the same time, the size of the degeneration resistor is limited by considerations in actual implementations, such as supply voltage, process variation, device size, and/or other considerations.

Figure 7:
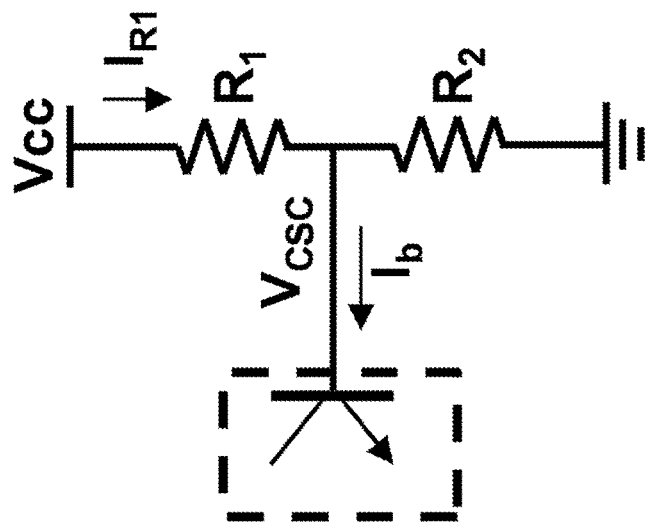
FIG. 7 is a simplified diagram illustrating a resistor divider circuit used in cascode amplifier according to embodiments of the present invention.

FIG. 7 is a simplified diagram illustrating a resistor divider circuit used in cascode amplifier according to embodiments of the present invention. This diagram is merely an example, which should not unduly limit the scope of the claims. One of ordinary skill in the art would recognize many variations, alternatives, and modifications. An objective is to to limit the influence of $\beta$ variation on $V_{CSC}$, size $R_1$ and $R_2$ such that $I_{R1} \gg I_b$. Here, choose $I_{R1} = 10 I_b$. If $I_b$ and $V_{CSC}$ are known:

$$V_{csc} = V_{CC} - R_1(I_{R1} + I_b) \approx V_{CC} - I_{R1} R_1$$

$$V_{CSC} = V_{CC} - R_1(I_{R1} + I_b) \approx V_{CC} - I_{R1}R_1$$

$$\rightarrow R_1 = \frac{V_{CC} - V_{CSC}}{I_{R1}}$$

$$R_2 = \frac{R_1}{\frac{V_{CC}}{V_{CSC}} - 1}$$

And when operating, $I_{R1}$ is chosen as small as possible within a given technology to maximize the THD enhancement. For MOSFETs, $I_{R1}$ can be chosen to be much smaller.

The use of a "degeneration resistor" in cascode amplifiers, as explained in this application, can be at least partially be explained by suppression of even order harmonics. By expanding the output current of a non-linear device when driven by an input voltage, the expansion using power series can be expressed by the following:

$$I_{out} = C_0 + C_1 V_{in} + C_2 V_{in}^2 + C_3 C_{in}^3 + \ldots$$

For an input voltage $V_{in} = A\cos(wt)$, the output is:

$$I_{out} = (C_0 + A^2 C_3/2) + (C_1 - A^3 C_4/4)\cos(wt) + (A^2 C_3/2)\cos(2wt) + (A^3 C_4/4)\cos(3wt) + \ldots$$

A differential signal can be produced by two such non-linear devices by applying two input signals with opposite polarities, which results in two output currents as follows:

$$I_{out}^+ = (C_0 + A^2 C_3/2) + (C_1 - A^3 C_4/4)\cos(wt) + (A^2 C_3/2)\cos(2wt) + (A^3 C_4/4)\cos(3wt) +$$

$$I_{out}^- = (C_0 + A^2 C_3/2) + (C_1 + A^3 C_4/4)\cos(wt) + (A^2 C_3/2)\cos(2wt)(A^3 C_4/4)\cos(3wt) +$$

Note that the individual currents may contain harmonic distortion products of every order ($2^{nd}$, $3^{rd}$, $4^{th}$, etc.).

A differential output signal may be defined as the difference between the two output currents:

$$I_{out}^+ - I_{out}^- = (0) + (0 - A^3 C_4/2)\cos(wt) + (0)\cos(2wt) - (A^3 C_4/2)\cos(3wt) + \ldots$$

Note that in this ideal case the even-order distortion products in the differential output are cancelled due to symmetry, as these components have equal magnitude and phase in the two output currents (i.e. they are a common-mode signal).

However, a differential-input amplifier is often required to produce a single output current or voltage, which is derived from one of the two output currents. It is to be further noted that the above explanation has an assumption that the non-linearity is produced only by the voltage-to-current (transconductance) of a non-linear device. This assumption is not always true, especially when active devices operate at frequencies where the effect of other non-linear components affect the device transfer function. For example, harmonic distortion can also be introduced by voltage-dependent capacitances of an active non-linear device such as the cascoding (e.g. common-base) stage. In these cases, cancellation of even-order distortion may not occur in the output signal, especially as the signal frequency increases. In the present invention, the degeneration resistor allows the gain of the cascoding device to be preferentially suppressed in the common-mode only, while not affecting the differential mode gain or bandwidth, thereby reducing the even-order distortion currents passed to the output loads. It is to be appreciated that embodiments of the present invention are unique in suppressing even-order harmonics in differential amplifiers with cascode configuration. The combination of peaking inductors and degeneration resistor in a differential cascode amplifier reduces the common-mode gain of a differential pair, without reducing the differential gain, which also means an improvement of the high-frequency common-mode rejection ratio (CMRR).

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A system comprising:
    an amplifier device comprising:
    a first transistor comprising a first base terminal and a first collector terminal, the first base terminal being coupled to a first input;
    a second transistor comprising a second base terminal and a second collector terminal, the second terminal base being coupled to a second input;
    a first peaking inductor coupled to the first collector terminal;
    a second peaking inductor coupled to the second collector terminal;
    a third transistor comprising a third base terminal and a first emitter terminal, the first emitter terminal being coupled to the first peaking inductor;
    a fourth transistor comprising a fourth base terminal and a second emitter terminal, the second emitter terminal being coupled to the second peaking inductor; and
    a degeneration resistor coupled to the third base terminal and the fourth base terminal; and
    a output proportional to an input, and the output coupled to the amplifier device.

2. The device of claim 1 wherein the first input and the second input comprise a pair of differential input signal.

3. The device of claim 1 wherein further comprising a voltage source coupled to the degeneration resistor.

4. The device of claim 1 wherein the first peaking inductor is associated with a bandwidth increase.

5. The device of claim 1 wherein the degeneration resistor is associated with a distortion reduction.

6. The device of claim 1 wherein the first transistor further comprises a third emitter terminal, the third emitter terminal being coupled to a degeneration resistor.

7. The device of claim 6 wherein the degeneration resistor is coupled to a bias current source.

8. The device of claim 1 wherein the third transistor further comprises a third collector terminal coupled to a load resistor.

9. The device of claim 8 wherein the third collector terminal is coupled to a first output.

10. The device of claim 9 wherein the fourth transistor further comprises a fourth collector terminal coupled to a second output.

11. The device of claim 10 wherein the first output and the second output comprise a differential output pair.

12. The device of claim 8 wherein the load resistor is coupled to a supply voltage.

13. A system comprising:
    an amplifier device comprising:
    a first transistor comprising a first gate terminal and a first drain terminal, the first gate terminal being coupled to a first input;
    a second transistor comprising a second gate terminal and a second drain terminal, the second gate terminal being coupled to a second input;
    a first peaking inductor coupled to the first drain terminal;

a second peaking inductor coupled to the second drain terminal;

a third transistor comprising a third gate terminal and a first source terminal, the first source terminal being coupled to the first peaking inductor;

a fourth transistor comprising a fourth gate terminal and a second source terminal, the second source terminal being coupled to the second peaking inductor; and a resistive element coupled to the third gate terminal and the fourth gate terminal; and an output coupled to an input, the output coupled to the amplifier device.

14. The device of claim 13 wherein the resistive element comprises a resistor divider.

15. The device of claim 13 wherein the first transistor comprises a NMOS transistor.

16. The device of claim 13 wherein the third gate terminal is directly coupled to the fourth gate terminal.

17. The device of claim 13 wherein the first transistor further comprises a third source terminal coupled to a degeneration resistor.

18. The device of claim 13 wherein the first peaking inductor and the second peaking inductor are matched.

19. A system comprising:

a differential cascode amplifier device comprising:

a first BJT transistor comprising a first base terminal and a first collector terminal and a first emitter terminal, the first base terminal being coupled to a first input;

a first degeneration resistor coupled to the first emitter terminal;

a second BJT transistor comprising a second base terminal and a second collector terminal and a second emitter terminal, the second terminal base being coupled to a second input;

a second degeneration resistor coupled to the second emitter terminal;

a first peaking inductor coupled to the first collector terminal;

a second peaking inductor coupled to the second collector terminal;

a third transistor comprising a third base terminal and a third emitter terminal, the third emitter terminal being coupled to the first peaking inductor;

a fourth transistor comprising a fourth base terminal and a fourth emitter terminal, the fourth emitter terminal being coupled to the second peaking inductor; and a degeneration resistor coupled to the third base terminal and the fourth base terminal; and an output coupled to an input, the output linearly proportional to the input, the input and the output coupled to the differential cascode amplifier device.

20. The device of claim 19 wherein the first degeneration resistor and the second degeneration resistor are matched.

* * * * *